(12) United States Patent
Luo et al.

(10) Patent No.: US 10,340,852 B2
(45) Date of Patent: Jul. 2, 2019

(54) BIAS BOOSTING CIRCUIT FOR AMPLIFIER

(71) Applicants: Sifen Luo, Ellicott City, MD (US);
Scott Kent Suko, Dayton, MD (US);
Jose M. Acevedo, Ellicott City, MD (US); Macarious Salib, Millersville, MD (US)

(72) Inventors: Sifen Luo, Ellicott City, MD (US);
Scott Kent Suko, Dayton, MD (US);
Jose M. Acevedo, Ellicott City, MD (US); Macarious Salib, Millersville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/783,375

(22) Filed: Oct. 13, 2017

(65) Prior Publication Data
US 2019/0115871 A1    Apr. 18, 2019

(51) Int. Cl.
| H03F 1/30 | (2006.01) |
| H03F 1/02 | (2006.01) |
| H03F 1/56 | (2006.01) |
| H01L 29/778 | (2006.01) |
| H03F 3/195 | (2006.01) |

(52) U.S. Cl.
CPC ....... *H03F 1/0205* (2013.01); *H01L 29/7787* (2013.01); *H03F 1/56* (2013.01); *H03F 3/195* (2013.01); *H03F 2200/222* (2013.01); *H03F 2200/258* (2013.01); *H03F 2200/387* (2013.01); *H03F 2200/451* (2013.01)

(58) Field of Classification Search
CPC ................ H03F 1/30; H03F 3/20; H03G 3/30

USPC ................................................ 330/296, 285
See application file for complete search history.

(56) References Cited

U.S. PATENT DOCUMENTS

| 3,513,406 | A | * | 5/1970 | Leuthauser | ........... H03F 1/0261 330/204 |
| 3,723,894 | A | * | 3/1973 | Benenati | .............. H03G 1/0058 330/145 |
| 6,055,162 | A | | 4/2000 | Tarrillo et al. | |

(Continued)

OTHER PUBLICATIONS

Jeon, et al.: "Input Harmonics Control Using Non-Linear Capacitor in GaAs FET Power Amplifier"; Microwave Symposium Digest, 1997, IEEE MTT-S International; Jun. 8-13, 1997; DOI: 10.1109/MWSYM.19797.602919; pp. 817-820.

(Continued)

*Primary Examiner* — Henry Choe
(74) *Attorney, Agent, or Firm* — Tarolli, Sundheim, Covell & Tummino LLP

(57) ABSTRACT

An amplification system can include a bias booster circuit and an amplifier that amplifies an input signal to drive a load. The bias boosting circuit can include a negative bias booster that applies a charge to an input node of the amplifier in response to a negative half-cycle of the input signal that exceeds a boost threshold level. The bias boosting circuit can also include a positive bias booster that discharges the input node of the amplifier during a positive half-cycle of the input signal that exceeds the boost threshold level. The discharging by the positive bias booster is slower than the charging by the negative bias booster to induce a bias voltage increase from a quiescent bias voltage on the input node of the amplifier.

18 Claims, 7 Drawing Sheets

(56) References Cited

U.S. PATENT DOCUMENTS

| | | | |
|---|---|---|---|
| 6,414,553 B1 | 7/2002 | Luo | |
| 6,492,875 B2* | 12/2002 | Luo | H03F 1/302 330/285 |
| 6,624,700 B2* | 9/2003 | Luo | H03F 1/0261 330/267 |
| 6,921,891 B2* | 7/2005 | Seitz | H01L 27/1443 250/208.1 |
| 6,922,107 B1 | 7/2005 | Green | |
| 7,049,891 B2 | 5/2006 | Yuen | |
| 7,365,604 B2* | 4/2008 | Luo | H03F 1/30 330/285 |
| 7,548,116 B2* | 6/2009 | Yamamoto | H03G 1/0058 330/284 |
| 7,612,616 B2* | 11/2009 | Deng | H03F 1/0205 330/253 |
| 8,138,836 B2* | 3/2012 | Matsuzuka | H03F 3/16 330/285 |
| 8,354,888 B2* | 1/2013 | Matsuzuka | H03F 1/0261 330/285 |
| 9,214,902 B2 | 12/2015 | Luo et al. | |
| 9,407,208 B2 | 8/2016 | Ho et al. | |
| 2003/0112073 A1* | 6/2003 | Luo | H03F 1/0266 330/285 |
| 2004/0066234 A1* | 4/2004 | Luo | H03F 1/0266 330/296 |
| 2007/0052479 A1* | 3/2007 | Wang | H03F 1/0261 330/285 |
| 2012/0146733 A1* | 6/2012 | Matsuzuka | H03F 1/0261 330/296 |
| 2016/0308500 A1* | 10/2016 | Luo | H03F 1/0205 |

OTHER PUBLICATIONS

Noh, et al.: "PCS/W-CDMA Dual-Band MMIC Power Amplifier with a Newly Proposed Linearizing Bias Circuit"; IEEE Journal of Solid-State Circuits, vol. 37, Issue 9, Sep. 2002; DOI: 10.1109/JSSC.2002.801169; pp. 1096-1099.

Toumazou, et al.: "Design and Application of a GaAs MESFET Current Mirror Circuits"; IEE Proceedings G-Circuits, Devices and Systems, vol. 137, Issue 2, Apr. 1990; DOI: 10.1049/ip-g2.1990.0018; pp. 101-108.

* cited by examiner

BIAS BOOSTING CIRCUIT FOR AMPLIFIER

TECHNICAL FIELD

This disclosure relates to an amplification system that includes a bias boosting circuit.

BACKGROUND

An amplifier, electronic amplifier or (informally) amp, is an electronic device that can increase the power of a signal (a time-varying voltage or current). An amplifier uses electric power from a power supply to increase the amplitude of a signal. The amount of amplification provided by an amplifier is measured by the amplifier's gain: the ratio of output signals to input signals. An amplifier can provide a power gain greater than one.

Amplifiers have a number of performance metrics related to gain. In particular, power-added efficiency (PAE) is a metric for rating the efficiency of a power amplifier that takes into account the effect of the gain of the amplifier. PAE is calculated as a percentage. Additionally, most amplifiers maintain a relatively constant gain for low-level input signals. However, at higher input signal levels, amplifiers go into saturation and that decreases the amplifier's gain, thereby causing non-linearity in the amplifier, which can be referred to as compression. The one decibel (1 dB) compression point (P1 dB) indicates the power level that causes the gain to drop by 1 dB from the amplifier's small signal value.

SUMMARY

Figure 1:
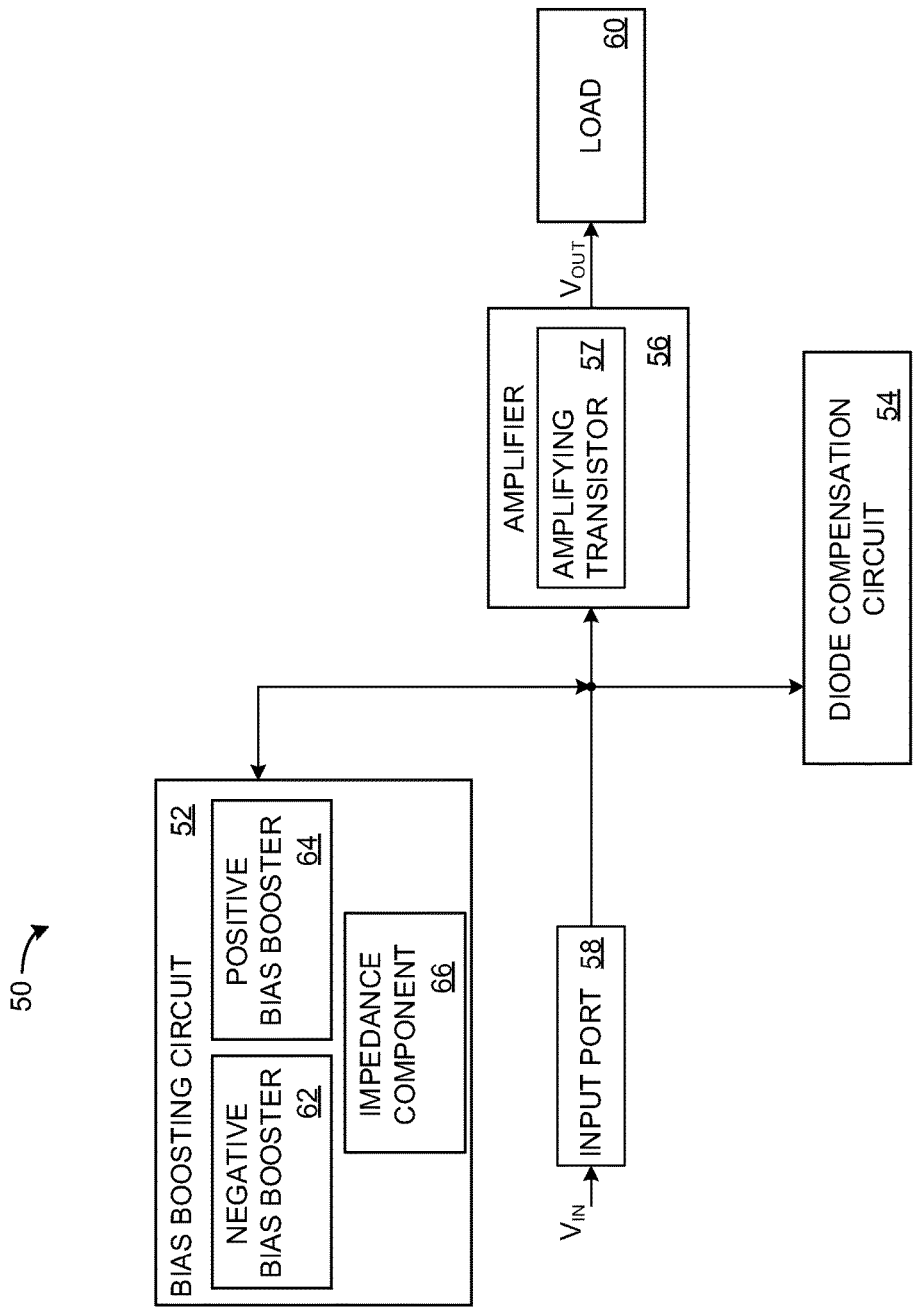
FIG. 1 illustrates a block diagram of an example of an amplification system with a bias boosting circuit and a diode-compensation circuit.

In one example, an amplification system can include a bias boosting circuit and an amplifier that amplifies an input signal to drive a load. The bias boosting circuit can include a negative bias booster that applies a charge to an input node of the amplifier in response to a negative half-cycle of the input signal that exceeds a boost threshold level. The bias boosting circuit can also include a positive bias booster that discharges the input node of the amplifier during a positive half-cycle of the input signal that exceeds the boost threshold level. The discharging by the positive bias booster is slower than the charging by the negative bias booster to induce a bias voltage increase on the input node of the amplifier.

In another example, an integrated circuit (IC) chip can include an amplifier having a plurality of field effect transistors (FETs) that amplify an input signal to drive a load. The IC chip can also include a bias boosting circuit that includes a negative bias booster that applies a charge to each gate of the plurality of FETs of the amplifier in response to a negative half-cycle of the input signal that exceeds a boost threshold level. The bias boosting circuit can also include a positive bias booster that discharges the input node of each gate of the plurality of FETs of the amplifier during a positive half-cycle of the input signal that exceeds the boost threshold level. The discharging by the positive bias booster is slower than the charging by the negative bias booster to induce a bias voltage increase on each gate of the plurality of FETs.

In yet another example, an amplification system can include an amplifier comprising a FET that amplifies an input signal to drive a load. The amplification system can also include a bias boosting circuit that accumulates a charge at a gate of the FET of the amplifier in response to multiple cycles of an input signal that exceeds a boost threshold level to induce a bias voltage on the gate of the amplifier. The amplification system can further include a diode-compensation circuit that limits a voltage drop at the gate of the FET to a predetermined level.

DETAILED DESCRIPTION

This disclosure relates to an amplification system with a bias boosting circuit and a diode-compensation circuit to bias an amplifier. The amplification system can be employed in a variety of high power operations, such as radio frequency (RF) processing or nearly any circuit where amplification is needed. The amplifier includes an amplifying transistor such as a field effect transistor (FET) or multiple FETs coupled in parallel that can be modeled as a single transistor. The bias boosting circuit is designed such that as input power to the amplifier increases, a charge on a gate of the amplifying transistor (a FET) accumulates, thereby inducing a voltage over multiple cycles of the input signal. Additionally, the diode-compensation circuit prevents the gate of the amplifying transistor dropping beyond a preset value in a manner described herein.

As one example, the bias boosting circuit can be formed with gallium nitride high electron mobility transistors (GaN HEMTs, or simply HEMTs). In such a situation, the HEMTs are arranged such that as an amplitude of the input signal (an alternating current (AC) signal) increases beyond a bias threshold level, a first HEMT of the bias boosting circuit turns on and a second HEMT of the biasing boosting circuit turns off to charge the gate of the amplifying transistor. During a positive half cycle of the input signal, the first HEMT is turned off, and the second HEMT of the bias boost circuit discharges the gate of the amplifying transistor. However, the boosting circuit is configured such that the second HEMT discharges the gate of the amplifying transistor slower than the first transistor charges the gate of the amplifying transistor, thereby accumulating a charge on the gate of the amplifying transistor over multiple cycles of the input signal. This accumulation of charge induces a bias voltage increase from a quiescent bias voltage at the gate of the amplifying transistor.

Continuing with this example, a gate voltage of the amplifying transistor with the bias boosting scheme reaches a peak and then drops as input power increases. The diode-compensation circuit is included to limit the gate voltage drop to a preset value depending on the value of a negative voltage supply connected to a diode connected transistor in the diode-compensation circuit.

As one example, the diode-compensation circuit can be implemented as a simple circuit using a source and drain connected transistor as a diode. One side of the diode is connected to a negative supply voltage and the other side is connected to the gate of the amplifying transistor. Thus, the diode-compensation circuit limits the negative swing of the AC input signal at the gate of the amplifying transistor to a diode drop plus the negative supply voltage (the preset limit).

The amplifier described in the present disclosure provides improved operational characteristics. In particular, the bias boosting circuit and diode-compensation circuit operate in concert to increase the linearity and a power add-efficiency (PAE) of the amplifier. Moreover, the bias boosting circuit and diode-compensation circuit improve the stability of the amplifier and reduce harmonic components.

FIG. 1 illustrates a block diagram of an amplification system 50 with a bias boosting circuit 52 and a diode-compensation circuit 54 to bias an amplifier 56. The amplification system 50 can be employed in a variety of high power operations, including RF processing and transmission (mobile devices), radar systems, etc. The amplification system 50, or some portion thereof, can be implemented on an integrated circuit (IC) chip.

The amplifier 56 includes an amplifying transistor 57. The amplifying transistor 57 can be representative of a single transistor or multiple amplifying transistors operating in parallel that could be modeled as a single transistor. The amplifying transistor 57 can be implemented with a field effect transistor (FET), such as a gallium nitride high electron mobility transistor (GaN HEMT) or other FET or a bipolar junction transistor (BJT). The amplifier 56 is configured to amplify an input signal $V_{IN}$ that is coupled to an input port 58 of the amplification system 50. The input signal, $V_{IN}$ is an AC signal. The input port 58 can be directly or indirectly coupled (e.g., via a filter or other component) to an input node of the amplifier 56. The input node of the amplifier 56 is coupled to a gate of the amplifying transistor 57.

The amplifier 56 is configured to amplify the input signal, $V_{IN}$ to generate an output signal, $V_{OUT}$ that drives a load 60. The load 60 can be implemented as an electrical load that represents a component or portion of a circuit that consumes (active) electric power. In some examples, the load 60 can be a transmission line coupled to an antenna for an RF transmitter, an electric motor, etc.

The bias boosting circuit 52 includes a negative bias booster 62 and a positive bias booster 64. The bias boosting circuit 52 further includes an impedance block 66 that sets a bias voltage (a bias boost) that is applied to the input node of the amplifier 56 in a manner described herein. The negative bias booster 62 is configured such that upon the amplitude of the input signal, $V_{IN}$ exceeding a boost threshold level, during a negative half-cycle of the input signal, $V_{IN}$, the negative bias booster 62 applies a charge to the gate of the amplifying transistor 57 of the amplifier 56. The amount of the charge applied to the gate of the amplifying transistor 57 is based on a resistive component (e.g., a resistor) and a reactive component (e.g., an inductor) of the impedance block 66.

During a positive half-cycle of the input signal, $V_{IN}$, the negative bias booster 62 ceases charging of the gate of the amplifying transistor 57, and the positive bias booster 64 discharges the gate of the amplifying transistor 57 (at the input node of the amplifier 56). Additionally, the discharging of the gate of the amplifying transistor 57 by the positive bias booster 64 is slower than the charging by the negative bias booster 62. In this manner, over multiple cycles of the input signal, $V_{IN}$, a charge is accumulated on the gate of the amplifying transistor 57. This accumulated charge induces the bias voltage increase from a quiescent bias voltage on the gate of the amplifying transistor 57. This bias voltage improves linearity of the amplifier 56. In particular, the bias voltage increase raises a one decibel (1 dB) compression point (P1 dB) of the amplifier 56. Moreover, implementing the bias boosting circuit 52 also improves a power-added efficiency (PAE) of the amplifier 56.

Further, as power of the input signal, $V_{IN}$ increases, the bias voltage increases to a peak and then drops with further increases to the power of the input signal, $V_{IN}$. The diode-compensation circuit 54 includes a diode-connected transistor (or diode) that limits the drop of the bias voltage at the gate of the amplifying transistor 57 to a preset value. This limit in voltage drop of the gate of the amplifying transistor 57 reduces the harmonic component levels of the amplifier 56. Additionally, the diode-compensation circuit 54 improves the linearity and the PAE of the amplifier 56.

Figure 2:
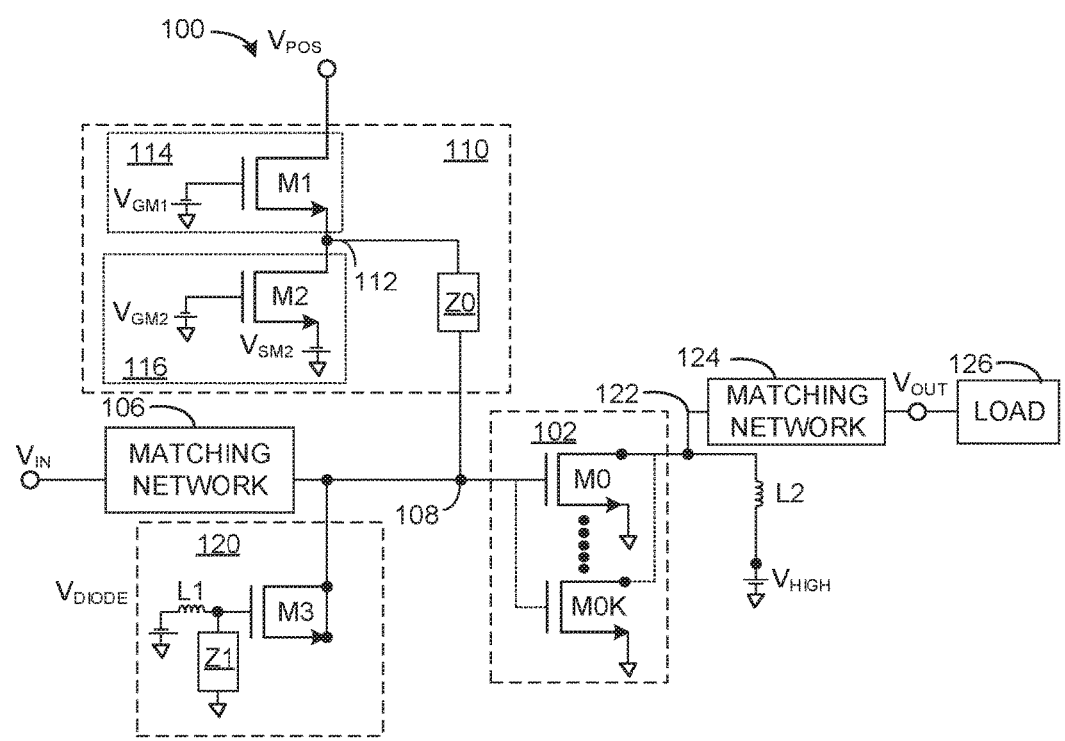
FIG. 2 illustrates a circuit diagram of an example of an amplification system with a bias boosting circuit and a diode-compensation circuit.

FIG. 2 illustrates a circuit diagram of an example of an amplification system 100 that increases a linearity and power efficiency of an amplifier 102. The amplification system 100 could be employed in nearly any electronic system, including, but not limited to RF applications, such as radar and/or radio transmission (e.g., mobile devices). Alternatively, the amplification system 100 can be employed to drive an electric motor. The amplification system 100 receives an input signal, $V_{IN}$ at an input port. The input signal, $V_{IN}$ can be an RF signal.

In some examples, the input signal, $V_{IN}$ can be provided to an input of a matching network 106. The matching network 106 can be a band pass filter, a high pass filter, a low pass filter, etc. In some examples, the matching network 106 can include a signal conditioner. For purposes of simplification of explanation, it is presumed that the matching network 106 outputs the input signal $V_{IN}$ to an input node 108 of the amplifier 102.

The amplifier 102 includes a transistor, M0 (an amplifying transistor). In the example illustrated, the transistor M0 is a single HEMT. However, it is understood that in other examples, the amplifier 102 can be implemented with multiple transistors M0K, where K is an integer greater or equal to 0 and/or another type of field effect transistor, such as a gallium arsenide pseudomorphic HEMT (GaAs pHEMT). The input node 108 of the amplifier 102 is coupled to a gate of the transistor M0.

The input node 108 is also coupled to a bias boosting circuit 110. The bias boosting circuit 110 includes an impedance block, Z0 coupled to the input node 108. The impedance block Z0 can include a resistive component, such as a resistor. The impedance block, Z0 can also include a reactive component, such as an inductor and/or a capacitor.

The impedance block, Z0 can also be coupled to a biasing node 112 of the bias boosting circuit 110. The biasing node 112 is coupled to a negative bias booster 114 and a positive bias booster 116 of the bias boosting circuit 110. The negative bias booster 114 can include a transistor M1. In at least one example, the transistor M1 is implemented as a GaN HEMT. In other examples, the negative bias booster 114 can be implemented with a different transistor type. Similarly, the positive bias booster 116 can include a transistor M2. In at least one example, the transistor M2 is implemented as a GaN HEMT. In other examples, the positive bias booster 116 can be implemented with a different transistor type.

A drain of the transistor M1 of the negative bias booster 114 can be coupled to a positive voltage, $V_{POS}$ (e.g., a rail voltage). In at least one example, the positive voltage, $V_{POS}$ can be a (DC-direct current) voltage of about 10 volts (V) (or some other voltage level). Moreover, a source of the transistor M1 is coupled to the biasing node 112. Additionally, a gate voltage, $V_{GM1}$ can be applied to a gate of the transistor M1. In some examples, the gate voltage, $V_{GM1}$ can be less than the positive voltage, $V_{POS}$. As one example, the gate voltage, $V_{GM1}$ can be about −5.7 V. The gate voltage, $V_{GM1}$ can define a bias threshold voltage for the bias boosting circuit 110.

Additionally, with respect to the positive bias booster 116, a drain of the transistor M2 can be coupled to the biasing node 112. A source of the transistor M2 can be coupled to a source voltage, $V_{SM2}$. In at least one example, the source voltage, $V_{SM2}$ can be about equal in magnitude and opposite in polarity to the positive voltage, $V_{POS}$. Thus, in at least one example, the source voltage, $V_{SM2}$ can be a voltage level of about −10 V. Additionally, a gate voltage, $V_{GM2}$ can be applied to a gate of the transistor M2. The gate voltage, $V_{GM2}$ can set to a level more negative (greater in magnitude with the same polarity) as the source voltage, $V_{SM2}$.

The amplification system 100 also includes a diode compensation circuit 120. The diode compensation circuit 120 can include a transistor M3 and an impedance block Z1. The transistor M3 can be implemented as a GaN HEMT (or a different type of transistor). A source and a drain of the transistor M3 is coupled to the input node 108 of the amplifier 102. Additionally, a diode voltage, $V_{DIODE}$ can be coupled to a gate of the transistor M3 and the impedance block Z1 through an inductor L1. The diode voltage, $V_{DIODE}$ can be a negative voltage. In some examples, the diode voltage, $V_{DIODE}$ can be about −5.6 V.

In some examples, the transistor M0 of the amplifier 102 can be a common-source transistor, with a source connected to an electrically neutral node (e.g., ground). Additionally, in examples where the amplifier 102 is implemented as a high-power RF transistor, the transistor M0 could be representative of a single transistor, or multiple transistors operating in concert, such as multi-finger transistors. In such a situation, the transistor M0 operates a model for a plurality of transistors.

Further, a drain of the transistor M0 is coupled to a drain node 122. The drain node 122 can also be coupled to a high voltage rail, $V_{HIGH}$ through an inductor L2. The high voltage rail, $V_{HIGH}$ defines the maximum voltage level for the output of the amplifier 102. The drain node 122 can also be coupled to a matching network 124. The matching network 124 can be implemented as a band pass filter, a low pass filter, a high pass filter or a combination thereof. In some examples, the matching network 124 can include a signal conditioner to remove noise on the drain node 122. For purposes of simplification of explanation, it is presumed that an output signal, $V_{OUT}$ on a drain node 122 of the transistor M0 of the amplifier 102 matches an output of the matching network 124.

The output signal, $V_{OUT}$ is applied to a load 126. In examples where the amplification system 100 is an RF amplification system, the load 126 can be representative of a transmission line and/or an antenna. In other examples, the load 126 can be representative of an electric motor or a loudspeaker. In fact, the load 126 can be representative of nearly any electrical load that consumes power. Accordingly, the high voltage rail, $V_{HIGH}$ varies based on the power needs of the load 126.

In operation, the input signal, $V_{IN}$ is an AC signal. If the amplitude of the input signal, $V_{IN}$ is below a boost threshold level, the amplification system 100 operates in a manner similar to a Class-A amplifier. That is, if the amplitude of the input signal, $V_{IN}$ is below the boost threshold level, the bias boosting circuit 110 and the diode compensation circuit 120 have little to no effect on the amplifier 102. In such a situation, the input signal, $V_{IN}$ is amplified by the transistor M0 and the output signal, $V_{OUT}$ is applied to the load 126.

Conversely, as an amplitude of the input signal, $V_{IN}$ increases, an amplitude of an instantaneous gate voltage of the transistor M0 of the amplifier 102 during a negative half-cycle of the input signal, $V_{IN}$ also increases. In situations where the amplitude of the input signal, $V_{IN}$ exceeds the boost threshold level, a negative cycle of the input signal, $V_{IN}$ drives the biasing node 112. As noted, the boost threshold level is set by the gate voltage of the transistor M1, $V_{GM1}$ of the negative bias booster 114. The voltage at the biasing node 112 controls the drain voltage of the transistor M2 of the positive bias booster 116. If the drain voltage of the transistor M2 is reduced to a level near the source voltage, $V_{MS2}$ or lower, the transistor M2 switches to (or remains in) the cut-off mode of operation. Additionally, in such a situation, the gate voltage of the transistor M1, $V_{GM1}$ and the positive voltage, $V_{POS}$ are selected such that during such a negative half-cycle of the input signal, $V_{IN}$ concurrently drives the gate-to-source voltage of the transistor M1, $V_{GSM1}$ to a level that causes the transistor M1 to operate in the saturation mode. That is, in the negative half-cycle, the transistor M2 of the positive bias booster 116 is turned off, and the transistor M1 of the negative bias booster 114 is turned on. Accordingly, during the negative half-cycle of the input signal, $V_{IN}$ (above the boost threshold level), the gate of the transistor M0 of the amplifier 102 (or multiple transistors) is charged by the transistor M1 via the impedance block Z0.

Additionally, assuming that the amplitude remains above the boost threshold, during a positive half-cycle of the input signal, $V_{IN}$, the voltage at the biasing node 112 swings to a level that turns off the transistor M1 of the negative bias booster 114. That is, the biasing node 112 (the source voltage of transistor M1) is at a level where the gate-to-source voltage, the transistor M1, $V_{GSM1}$ is below a cutoff voltage of the transistor M1. In this situation, the transistor M2 of the positive bias booster 116 discharges the gate of the transistor M0 of the amplifier 102 across the drain and source of the transistor M2.

A source impedance of the transistor M1 of the negative bias booster 114 (operating in the saturation mode) is much smaller than the drain impedance of the transistor M2 of the positive bias booster 116. Accordingly, the charge rate of the gate of the transistor M0 of the amplifier 102 during the negative half-cycle of the input signal, $V_{IN}$ is faster than the discharge rate of the gate of the transistor M0 of the amplifier 102 during the positive half-cycle of the input signal, $V_{IN}$. Therefore, over multiple cycles of the input signal, $V_{IN}$, a charge accumulates on the gate of the transistor M0 of the amplifier 102. Since the gate voltage of the transistor M0, $V_{GM0}$ increases as a function of the accumulated charge, the average gate voltage of the transistor M0, $V_{GM0}$ increases over multiple full-cycles of the input signal, $V_{IN}$ to the bias voltage set by the impedance block Z0. In particular, the bias voltage can be controlled by a resistive element (e.g., "R0") of the impedance block, Z0.

To reduce the loading effect of the bias boosting circuit 110, the size (e.g., channel length, channel width and oxide thickness) of the transistor M1 of the negative bias booster 114 and the transistor M2 of the positive bias booster 116 are selected to be smaller than the size of the transistor M0 of the amplifier 102. For example, the channel width of the transistors M1 and M2 can be about one-eighth (⅛) the channel width of the transistor M0 of the amplifier 102.

As explained, the bias boosting circuit 110 increases an average gate voltage of the transistor M0, $V_{GM0}$ of the amplifier 102. Such an increase in an average gate voltage, $V_{GM0}$ of the transistor M0 (which can represent multiple transistors) can improve linearity of the transistor M0. In particular, the output power at one decibel (1 dB) gain compression point (P1 dB) can be raised. Additionally, in situations where a higher power efficiency for the amplification system 100 is desired, the positive voltage, $V_{POS}$ can be reduced. Furthermore, as noted, in situations where the input voltage, $V_{IN}$ is lower than the boost threshold, the bias boosting circuit 110 has little to no effect on the operation of the amplifier 102.

In examples where the transistor M0 of the amplifier 102 is a power transistor, discrete components, such as series and/or shunt resistors and/or capacitors can be added to the amplification system 100 (e.g., in the matching network 106 and/or the matching network 124 or other places) to improve stability. Additionally, the bias boosting circuit 110 also improves stability of the amplification system 100.

Further, the diode compensation circuit 120 is configured such that the transistor M3 operates as a diode. In particular, the gate of the transistor M3 of the diode compensation circuit 120 is coupled to the negative voltage supply, $V_{DIODE}$. The transistor M3 of the diode compensation circuit 120 limits the negative swing of the input signal, $V_{IN}$ applied to the input node 108 to a diode drop (between the source and drain of the transistor M3) plus the negative supply voltage, $V_{DIODE}$. Accordingly, the diode compensation circuit 120 reduces saturation of the transistor M0 of the amplifier 102 as the input signal, $V_{IN}$ further increases in the saturation. Therefore, the diode-compensation circuit 120 reduces power in second and higher-order harmonics output by the amplifier 102, which increases a PAE (power-added efficiency) of the amplification system 100.

It is noted that in some examples, the diode compensation circuit 120 can be implemented in a different manner. For instance, in some examples, a stack-up of several (e.g., five (5)) diode connected transistors can be employed in place of the transistor M3 and the negative supply voltage $V_{DIODE}$. Alternatively, the diode compensation circuit 120 can be implemented with a diode in place of the transistor M3.

Still further, in some examples, the amplification system 100 (or some portion thereof) can be implemented on an IC chip. As noted, in some examples, the impedance block Z0 of the bias boosting circuit 110 can include an inductor. In examples where the amplification system 100 is implemented as an IC chip, the inductor can be a relatively small inductor of about 0.5 nano-Henry (nH) or less. Accordingly, the small inductor of the impedance block Z0 is compatible with fabrication on an IC chip.

Figure 3:
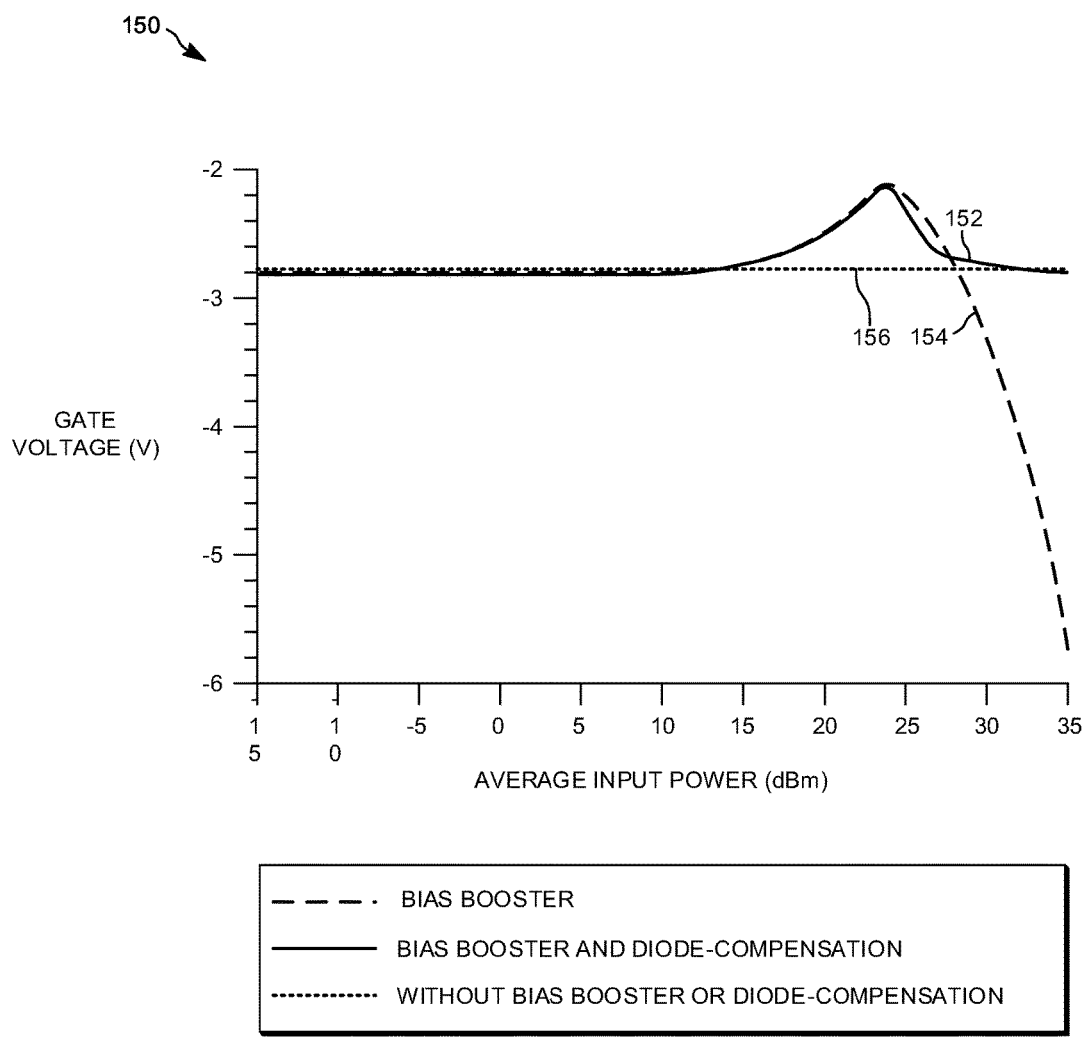
FIG. 3 illustrates an example of a chart that plots a gate voltage of an amplifier as a function of average input power.

FIG. 3 illustrates a chart 150 that plots a gate voltage (in Volts (V) of the transistor M0 of the amplifier 102 as a function of an average input power (in decibels-milliwatts (dBm)) of the input signal, $V_{IN}$ of FIG. 2. The chart 150 includes a graph 152 depicting the gate voltage of the transistor M0 with both the bias boosting circuit 110 and the diode compensation circuit 120 of FIG. 2 included. The chart 150 also includes a graph 154 depicting the gate voltage of the transistor M0 with the bias boosting circuit 110 included and the diode compensation circuit 120 of FIG. 2 omitted. The chart 150 further includes a graph 156 depicting the gate voltage of the transistor M0 wherein both the bias boosting circuit 110 and the diode compensation circuit 120 of FIG. 2 are omitted and a DC offset (bias) is applied to the gate of the transistor M0. As illustrated by the graphs 152 and 154 (as compared to the graph 156), inclusion of the bias boosting circuit 110 increases the gate voltage at higher input signal powers. Furthermore, as illustrated by the graph 152 (as compared to the graph 154), inclusion of the diode-compensation circuit 120 limits the negative voltage drop at gate of the transistor M0.

Figure 4:
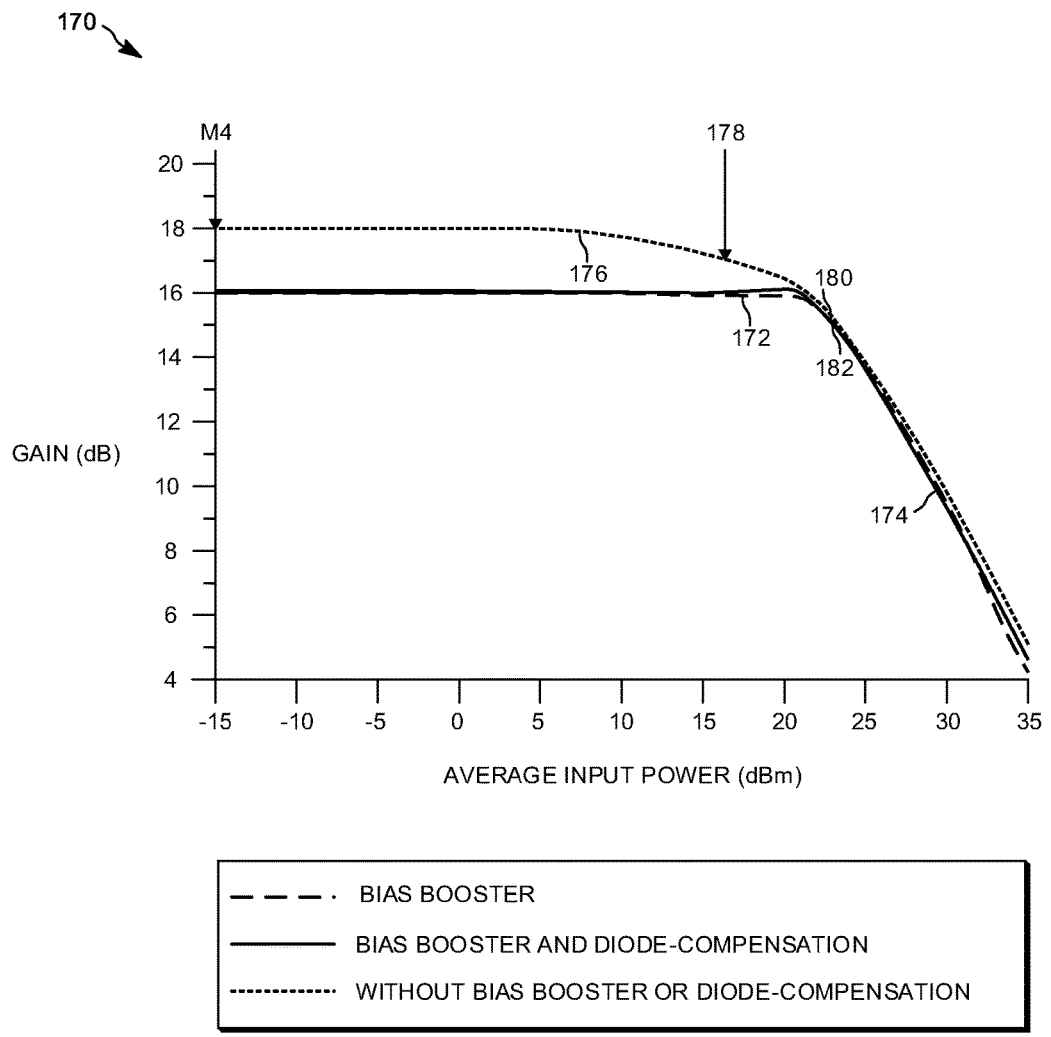
FIG. 4 illustrates an example of a chart that plots a gain of an amplifier as a function of average input power.
Figure 5:
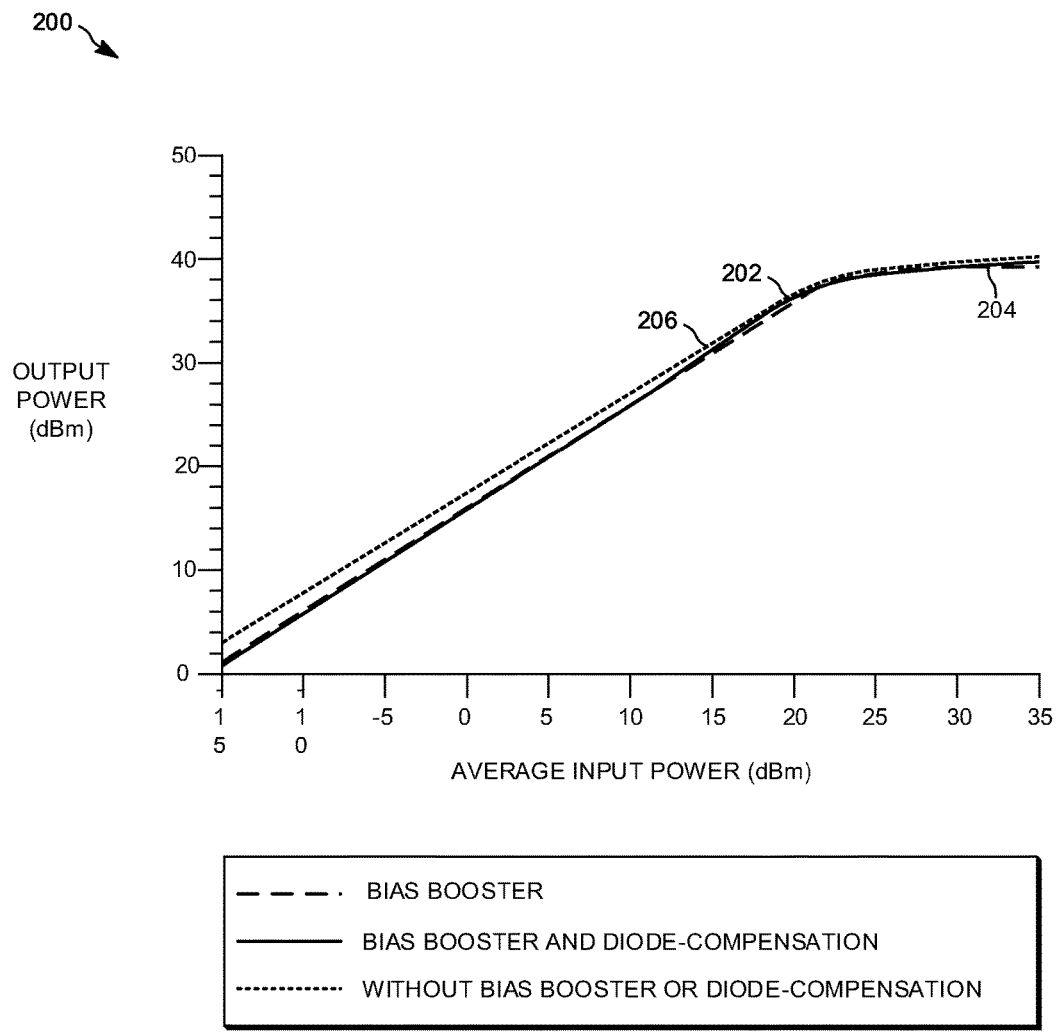
FIG. 5 illustrates an example of a chart that plots an output power of an amplifier as a function of average input power.
Figure 6:
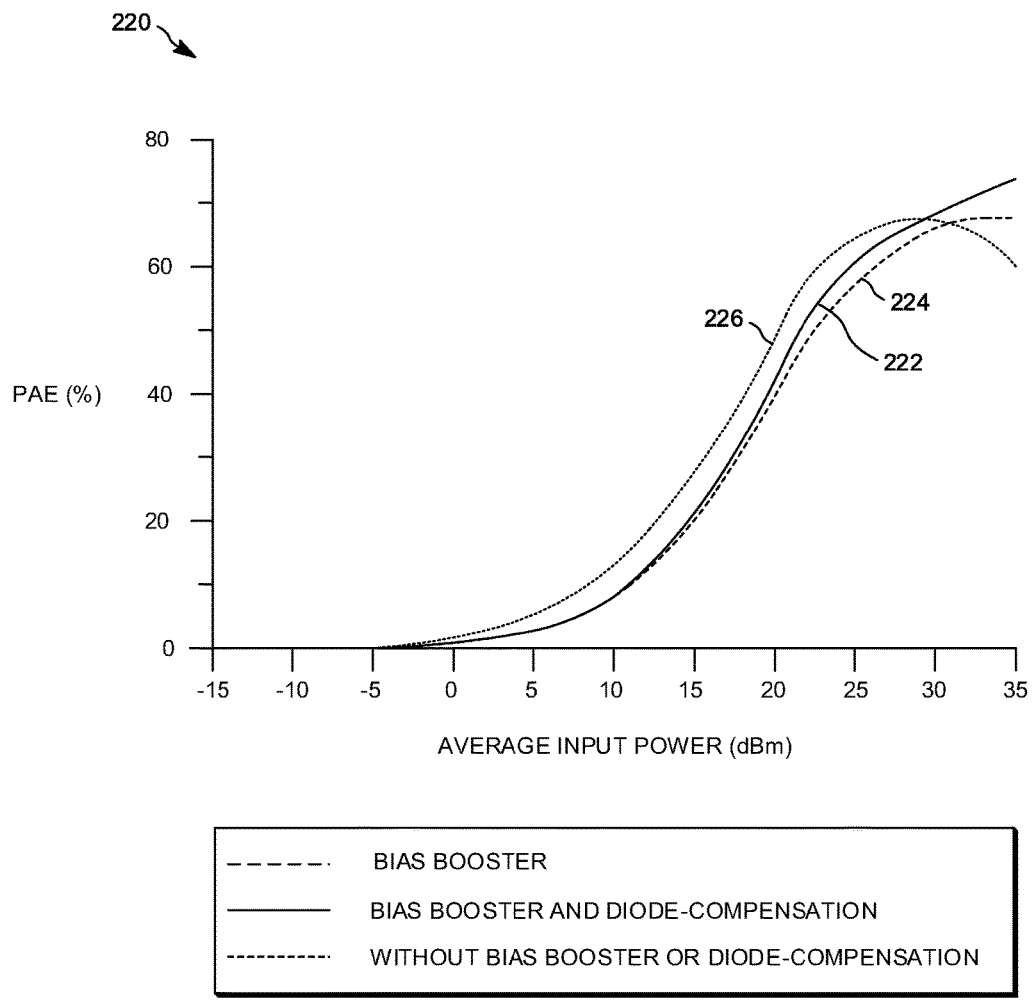
FIG. 6 illustrates an example of a chart that plots a power-added efficiency (PAE) of an amplifier as a function of average input power.

FIGS. 4-6 illustrates a charts 170, 200 and 220 that plot output characteristics as the amplifier 102 of FIG. 2 as a function of the average input power (in dBm) of the input signal, $V_{IN}$. For purposes of direct comparison, the charts 170, 200 and 220 employ the same scaled horizontal axis. In particular, the chart 170 plots a gain in decibels (dB) of the amplifier 102 of FIG. 2 as a function of the average input power (in dBm) of the input signal, $V_{IN}$. The chart 170 includes a graph 172 depicting the gain of the amplifier 102 with both the bias boosting circuit 110 and the diode compensation circuit 120 of FIG. 2 included. The chart 170 also includes a graph 174 depicting the gain of the amplifier 102 with the bias boosting circuit 110 included and the diode compensation circuit 120 of FIG. 2 omitted. The chart 170 further includes a graph 176 depicting the gain of the amplifier 102 wherein both the bias boosting circuit 110 and the diode compensation circuit 120 of FIG. 2 are omitted and a DC offset (bias) is applied to the input of the amplifier 102. As illustrated by the graphs 172 and 174 (as compared to the graph 176), inclusion of the bias boosting circuit 110 increases the linearity of the amplifier 102, particularly at average input powers from about 5 dBm to about 20 dBm.

Referring to FIG. 5, the chart 200 includes a graph 202 that plots an output power (in dBm) of the amplifier 102 of FIG. 2 as a function of the average input power (in dBm) of the input signal, $V_{IN}$. The chart 200 includes a graph 202 depicting the output power of the amplifier 102 with both the bias boosting circuit 110 and the diode compensation circuit 120 of FIG. 2 included. The chart 200 also includes a graph 204 depicting the output power of the amplifier 102 with the bias boosting circuit 110 included and the diode compensation circuit 120 of FIG. 2 omitted. The chart 200 further includes a graph 206 depicting the output power of the amplifier 102 wherein both the bias boosting circuit 110 and the diode compensation circuit 120 of FIG. 2 are omitted and a DC offset (bias) is applied to the input of the amplifier 102.

Referring to FIG. 6, the chart 220 plots a power-added efficiency (PAE, in percentage (%)) of the amplifier 102 of FIG. 2 as a function of the average input power (in dBm) of the input signal, $V_{IN}$. The chart 220 includes a graph 222 depicting the PAE of the amplifier 102 with both the bias boosting circuit 110 and the diode compensation circuit 120 of FIG. 2 included. The chart 220 also includes a graph 224 depicting the PAE of the amplifier 102 with the bias boosting circuit 110 included and the diode compensation circuit 120 of FIG. 2 omitted. The chart 220 further includes a graph 226 depicting the PAE of the amplifier 102 wherein both the bias boosting circuit 110 and the diode compensation circuit 120 of FIG. 2 are omitted and a DC offset (bias) is applied to the input of the amplifier 102.

In comparison of the charts 170, 200 and 220, the graph 176 (representing the amplifier 102 with the bias boosting circuit 110 and the diode-compensation circuit 120 being omitted) has a P1 dB (one decibel of compression) point labeled as reference number 178 of FIG. 4 at an input power of about 15.3 dBm. As illustrated by the charts 200 and 220 of FIGS. 5 and 6, at the P1 dB point, 15.3 dBm for graphs 206 and 226, the output power at 15.3 dBm is about 32.5 dBm and the PAE is about 29.3%.

Additionally, as illustrated by the reference number 180, the graph 172 (representing the amplifier 102 with the bias boosting circuit 110 and omitting the diode-compensation circuit 120) has a P1 dB point at about 23.2 dBm. At the same input power, as illustrated by the charts 200 and 220 of FIGS. 5 and 6, at the P1 dB point, 23.2 dBm for graphs 204 and 224, the output power at 23.2 dBm is about 38.4 dBm and the PAE is about 53.1%.

Further still, as illustrated by the reference number 182, the graph 174 (representing the amplifier 102 with the bias boosting circuit 110 and the diode-compensation circuit 120 included) has a P1 dB point at about 23.5 dBm. At the same input power, as illustrated by the charts 200 and 220 of FIGS. 5 and 6, at the P1 dB point, 23.5 dBm for graphs 202 and 222, the output power at 23.5 dBm is about 38.4 dBm and the PAE is about 56.1%. Thus, as indicated by the charts 170, 200 and 220 inclusion of the bias boosting circuit 110 raises the P1 dB point (linearity) and the PAE (power-added efficiency) of the amplification system 100 of FIG. 2. Further, as indicated by the charts 170, 200 and 220 inclusion of the diode-compensation circuit 120 further raises the P1 dB point and PAE of the amplification system 100 of FIG. 2. In examples where the amplification system 100 is implemented on a mobile device (e.g., a smart phone), improvement of the PAE of the amplifier 102 can extend battery life of the mobile device.

Figure 7:
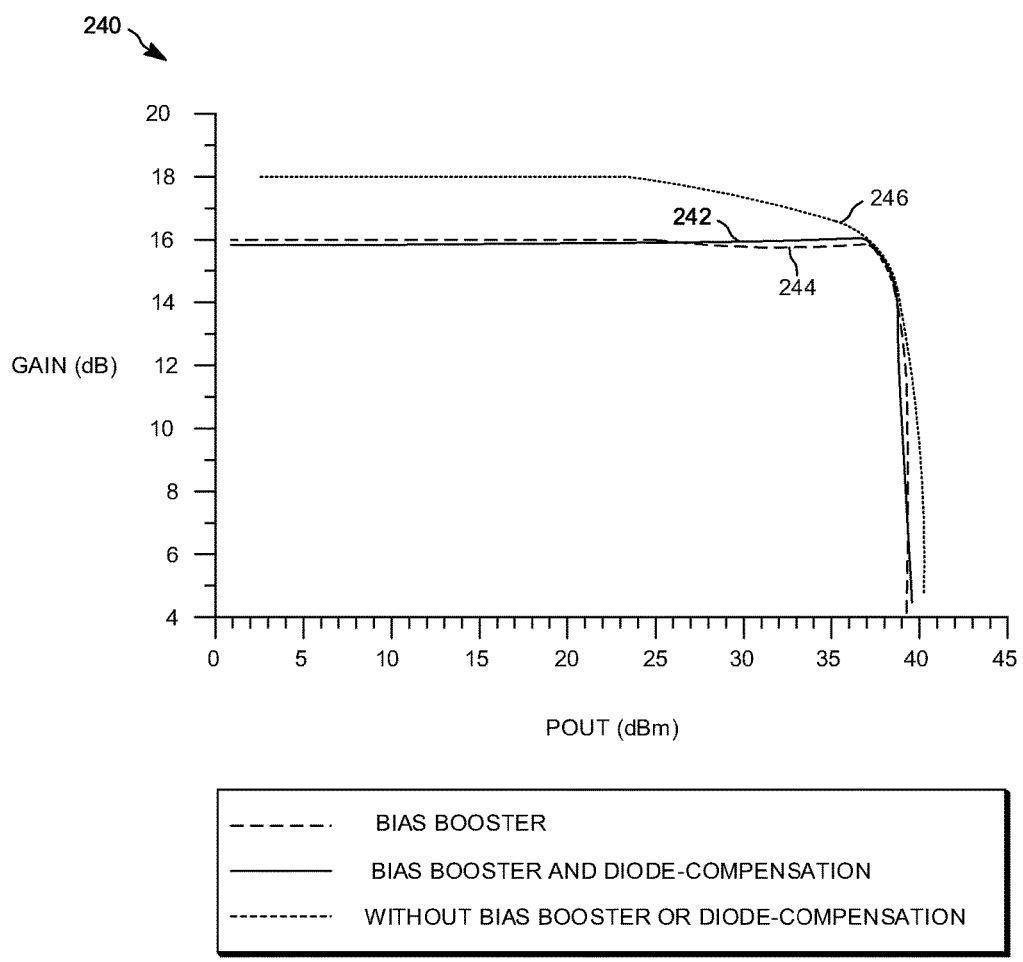
FIG. 7 illustrates an example of a chart that plots gain of an amplifier as a function of output power.

FIG. 7 illustrates a chart 240 that plots a gain (in dB) of the amplifier 102 of FIG. 2 as a function of the output power, Pout (in decibels-milliwatts (dBm)). The chart 240 includes a graph 242 depicting the gain of the amplifier 102 with both the bias boosting circuit 110 and the diode compensation circuit 120 of FIG. 2 included. The chart 240 also includes a graph 244 depicting the gain of the amplifier 102 with the bias boosting circuit 110 included and the diode compensation circuit 120 of FIG. 2 omitted. The chart 240 further includes a graph 246 depicting the gain of the amplifier 102 wherein both the bias boosting circuit 110 and the diode compensation circuit 120 of FIG. 2 are omitted and a DC offset (bias) is applied to the input of the amplifier 102. As illustrated by the graphs 242 and 244 (as compared to the graph 246), inclusion of the bias boosting circuit 110 increases the linearity of gain of the amplifier 102, particularly at output powers of about 25 dBm to 38 dBm.

Referring back to FIG. 2, as demonstrated by the charts 170, 200 and 220 of FIGS. 4-6, the P1 dB (1 decibel compression) point of the amplifier 102 can be raised (boosted) with the inclusion of the bias boosting circuit 110 and the diode-compensation circuit 120. Additionally, as illustrated by the chart 240 of FIG. 7, inclusion of the bias boosting circuit 110 and the diode-compensation circuit 120 improves the gain linearity of the amplifier 102. In some situations, such as low-power applications, the boosting of the P1 dB point of the amplifier 102 allows a reduction of size of the transistor M0 of the amplifier 102 (which may represent multiple transistors). For instance, if the P1 dB is boosted by 3 dB, the size (gate width, channel width and channel length) of the transistor M0 of the amplifier 102 may be reduced by one-half. The reduction of the size of the transistor M0 can directly reduce a die size of an IC chip that implements the amplification system 100.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An amplification system comprising:
   an amplifier comprising a field effect transistor (FET) that amplifies an input signal to drive a load and an amplifier transistor; and
   a bias boosting circuit comprising:
      a negative bias booster that applies a charge to an input node of the amplifier in response to a negative half-cycle of the input signal that exceeds a boost threshold level, wherein the negative bias booster includes a negative bias boost transistor;
      a positive bias booster that discharges the input node of the amplifier during a positive half-cycle of the input signal that exceeds the boost threshold level, wherein the discharging by the positive bias booster is slower than the charging by the negative bias booster to induce a bias voltage increase from a quiescent bias voltage on the input node of the amplifier, wherein the positive bias booster includes a positive bias boost transistor;
      a biasing node that couples the negative bias booster and the positive bias booster;
      an impedance block that couples the biasing node to the input node, wherein the impedance block comprising a resistive component and an inductive component; and
      wherein a channel width of the negative bias boost transistor and a channel width of the positive bias boost transistor are smaller than a channel width of the amplifying transistor and a source impedance of the negative bias boost transistor is smaller than a drain impedance of the positive bias boost transistor.

2. The amplification system of claim 1, wherein the FET of the amplifier is connected in a common-source configuration and a gate of the field effect transistor is coupled to the input node of the amplifier.

3. The amplification system of claim 1, wherein the FET of the amplifier is a given FET and wherein the amplifier comprises:
   a plurality of field effect transistors (FETs), the given FET being one of the plurality of FETS, wherein a gate of each of the plurality of FETs is coupled to the input node of the amplifier.

4. The amplification system of claim 1, wherein the negative bias boost transistor comprises:
   a given gallium nitride high electron mobility transistor (HEMT), wherein a source of the given HEMT is coupled to the biasing node, a drain of the given HEMT is coupled to a positive voltage source and a gate of the given HEMT is coupled to a negative voltage source, wherein the negative-half cycle of the input signal causes the given HEMT to transition to operate in the saturated mode, and the positive half-cycle of the input signal causes the given HEMT to operate in the cutoff mode.

5. The amplification system of claim 4, wherein the positive bias boost transistor comprises:
another HEMT, wherein a drain of the other HEMT is coupled to the biasing node, a source of the other HEMT is coupled to a second negative voltage source and a gate of the other HEMT is coupled to a third negative voltage source, wherein the negative-half cycle of the input signal causes the other HEMT to operate in the cutoff mode, and the positive half-cycle of the input signal allows the discharge of the charge at the input node of the amplifier through the drain of the other HEMT to the source of the other HEMT.

6. The amplification system of claim 1, further comprising a diode-compensation circuit coupled to the input node of the amplifier that limits a drop of the bias voltage on the input node of the amplifier.

7. The amplification system of claim 6, wherein the diode-compensation circuit comprises a gallium nitride high electron mobility transistor (HEMT), wherein a drain and a source of the HEMT are coupled to the input node of the transistor.

8. The amplification system of claim 7, wherein a negative bias voltage is applied to a gate of the HEMT.

9. The amplification system of claim 1, wherein the load comprises a transmission line of a radio frequency (RF) antenna.

10. An integrated circuit (IC) chip comprising:
an amplifier comprising a plurality of field effect transistors (FETs) that amplify an input signal to drive a load; and
a bias boosting circuit comprising:
a negative bias booster that applies a charge to each gate of the plurality of FETs of the amplifier in response to a negative half-cycle of the input signal that exceeds a boost threshold level and includes a negative bias boost transistor;
a positive bias booster that includes a positive bias boost transistor and discharges an input node of each gate of the plurality of FETs of the amplifier during a positive half-cycle of the input signal that exceeds the boost threshold level, wherein the discharging by the positive bias booster is slower than the charging by the negative bias booster to induce a bias voltage increase from a quiescent bias voltage on each gate of the plurality of FETs;
a biasing node that couples the negative bias booster and the positive bias booster;
an impedance block that couples the biasing node to the input node, wherein the impedance block comprising a resistive component and an inductive component; and
wherein a channel width of the negative bias boost transistor and a channel width of the positive bias boost transistor are smaller than a channel width of each of the plurality of FETs of the amplifier and a source impedance of the negative bias boost transistor is smaller than a drain impedance of the positive bias boost transistor.

11. The IC chip of claim 10, further comprising:
a diode compensation circuit that limits a voltage drop of each gate of the plurality of FETs.

12. The IC chip of claim 10, wherein the inductive component of the impedance block comprises an inductor.

13. The IC chip of claim 10, wherein the impedance block sets the bias voltage for the gate of each of the plurality of FETs.

14. The IC chip of claim 10,
wherein the negative bias boost transistor comprises a given gallium nitride high electron mobility transistor (HEMT), wherein a source of the given HEMT is coupled to the biasing node, a drain of the given HEMT is coupled to a positive voltage source and a gate of the given HEMT is coupled to a first negative voltage source, wherein the negative-half cycle of the input signal causes the given HEMT to transition to operate in the saturated mode, and the positive half-cycle of the input signal causes the given HEMT to operate in the cutoff mode; and
wherein the positive bias boost transistor comprises another HEMT, wherein a drain of the other HEMT is coupled to the biasing node, a source of the other HEMT is coupled to a second negative voltage source and a gate of the other HEMT is coupled to a third negative voltage source, wherein the negative-half cycle of the input signal causes the other HEMT to operate in the cutoff mode, and the positive half-cycle of the input signal allows the discharge of the charge at each gate of the plurality of FETs through the drain of the other HEMT to the source of the other HEMT.

15. The IC chip of claim 14, wherein the given HEMT and the other HEMT of the bias boosting circuit are smaller than the plurality of FETs of the amplifier.

16. The IC chip of claim 10, wherein the bias voltage improves the linearity and power-added efficiency (PAE) of the amplifier by increasing a one decibel compression point of the amplifier.

17. An amplification system comprising:
an amplifier comprising a field effect transistor (FET) that amplifies an input signal to drive a load;
a bias boosting circuit that accumulates a charge at a gate of the FET of the amplifier in response to multiple cycles of an input signal that exceeds a boost threshold level to induce a bias voltage increase from a quiescent bias voltage on the gate of the amplifier, wherein the bias boosting circuit includes a positive bias boost transistor and a negative bias boost transistor such that a channel width of the negative bias boost transistor and a channel width of the positive bias boost transistor are smaller than a channel width of the FET of the amplifier;
a diode-compensation circuit that limits a voltage drop at the gate of the FET to a predetermined level;
a biasing node that couples the negative bias booster and the positive bias booster;
an impedance block that couples the biasing node to an input node, wherein the impedance block comprising a resistive component and an inductive component; and
wherein a source impedance of the negative bias boost transistor is smaller than a drain impedance of the positive bias boost transistor.

18. The amplification system of claim 17, wherein the bias boosting circuit discharges the charge at the gate of the FET a slower rate than the bias boosting circuit applies the charge to the gate of the FET to accumulate the charge.

* * * * *